(12) United States Patent
Mahler et al.

(10) Patent No.: US 8,129,831 B2
(45) Date of Patent: Mar. 6, 2012

(54) CHIP ARRANGEMENT AND METHOD FOR PRODUCING A CHIP ARRANGEMENT

(75) Inventors: Joachim Mahler, Regensburg (DE); Alfred Haimerl, Sinzing (DE); Michael Bauer, Nittendorf (DE)

(73) Assignee: Infineon Technologies AG, Neubiberg (DE)

( * ) Notice: Subject to any disclaimer, the term of this patent is extended or adjusted under 35 U.S.C. 154(b) by 417 days.

(21) Appl. No.: 11/675,956

(22) Filed: Feb. 16, 2007

(65) Prior Publication Data

US 2008/0173998 A1 Jul. 24, 2008

(30) Foreign Application Priority Data

Jan. 18, 2007 (DE) .................. 10 2007 002 807

(51) Int. Cl.
*H01L 21/02* (2006.01)
(52) U.S. Cl. ........ 257/686; 257/735; 257/734; 257/730; 257/E25.013
(58) Field of Classification Search .................. 257/686, 257/E25.013, 735, 734, 730
See application file for complete search history.

(56) References Cited

U.S. PATENT DOCUMENTS

| 5,528,079 | A | 6/1996 | McIver | |
|---|---|---|---|---|
| 6,512,304 | B2 | 1/2003 | Ewer | |
| 6,861,288 | B2 * | 3/2005 | Shim et al. | 438/109 |
| 7,382,000 | B2 * | 6/2008 | Terao | 257/177 |
| 7,557,443 | B2 * | 7/2009 | Ye et al. | 257/723 |
| 2002/0125550 | A1 | 9/2002 | Estacio | |
| 2004/0004286 | A1 | 1/2004 | Eide | |
| 2004/0063240 | A1 | 4/2004 | Madrid et al. | |
| 2005/0106779 | A1 * | 5/2005 | Bolken et al. | 438/106 |
| 2005/0263859 | A1 * | 12/2005 | Kime et al. | 257/659 |
| 2006/0055027 | A1 * | 3/2006 | Kitabatake et al. | 257/706 |
| 2006/0145319 | A1 | 7/2006 | Sun et al. | |

FOREIGN PATENT DOCUMENTS

DE 19946194 12/2000

* cited by examiner

*Primary Examiner* — Junghwa M Im
(74) *Attorney, Agent, or Firm* — Dicke, Billig & Czaja, PLLC

(57) ABSTRACT

A chip arrangement includes semiconductor chips coupled to opposing sides of an insulating layer. The arrangement includes a first semiconductor chip having a first chip surface presenting a first chip conductive region. An electrically insulating layer includes a first layer surface presenting a first layer conductive region, and a second, opposing surface presenting a second layer conductive region. The electrically insulating layer is coupled to the first semiconductor chip by applying the first layer conductive region to the first chip conductive region. The electrically insulating layer is then coupled to the second chip conductive region by applying the second layer conductive region to the second chip conductive region.

9 Claims, 3 Drawing Sheets

CHIP ARRANGEMENT AND METHOD FOR PRODUCING A CHIP ARRANGEMENT

RELATED APPLICATION AND CLAIM OF PRIORITY

This application claims the benefit and priority of German Patent Application 10 2007 002 807.7 filed on Jan. 18, 2007.

FIELD OF THE INVENTION

The following invention relates to a chip arrangement and method for producing a chip arrangement.

BACKGROUND OF THE INVENTION

In the semiconductor-processing industry there is an increasing need for integrated circuits to be arranged three-dimensionally, that is to say stacked one above another within a chip arrangement. This need results, on the one hand, from the general desire to increase the packing density of electronic components and functions. In addition, there are also situations in which semiconductor chips interact functionally, for example, when a first semiconductor chip is driven by a second semiconductor chip, and, to shorten the signal paths between the connection contacts of the two semiconductor chips, it is beneficial to arrange the two semiconductor chips one above another.

In producing arrangements of stacked semiconductor chips, it is possible to use connecting wires for connecting the chips to the other circuitry. One disadvantage of this production method, however, is that welding or soldering the connecting wires requires precision work and, thus, results in a comparatively high expense. A further possibility for producing chip arrangements of stacked semiconductor chips uses flip-chip technology. Besides the relatively complicated process of forming contacts, which is usually effected by means of a ball grid array (BGA), a further disadvantage of the flip-chip method is that it is not readily possible to stack a plurality of chips one above another.

Consequently, there is a need to reduce the complexity and cost in the production of chip arrangements of stacked chips and at the same time also to provide a possibility of enabling larger numbers of semiconductor chips to be stacked one above another.

SUMMARY OF THE INVENTION

Against this background, a stacked chip arrangement and a method of forming a stacked chip arrangement are disclosed.

In accordance with one aspect of the invention, an apparatus including a chip arrangement is disclosed. A first semiconductor chip has a first chip surface presenting a first chip conductive region. A second semiconductor chip has a second chip surface presenting a second chip conductive region. An electrically insulating layer includes a layer body comprised of a material. A first surface of the insulating layer on a first side of the layer body presents a first layer conductive region. A second layer surface on an opposite side of the layer body presents a second layer conductive region. In the chip arrangement, the first layer conductive region is electrically coupled with the first chip conductive region, and the second layer conductive region is electrically coupled with the second chip conductive region.

In accordance with a further aspect of the invention, a method for producing a chip arrangement is disclosed. A first semiconductor chip having a first chip surface presenting a first chip conductive region is provided. A second semiconductor chip having a second chip surface presenting a second chip conductive region also is provided. An electrically insulating layer also is provided. The layer includes a layer body comprised of a material. A first layer surface disposed on a side of the layer body presents a first layer conductive region. A second layer surface disposed on an opposing side of the layer body presents a second layer conductive region. The first layer conductive region is coupled with the first chip conductive region, and the second layer conductive region is electrically coupled with the second chip conductive region.

BRIEF DESCRIPTION OF THE DRAWINGS

Embodiments of the invention are explained in more detail below in exemplary fashion with reference to the drawings, in which.

DETAILED DESCRIPTION OF EXEMPLARY IMPLEMENTATIONS

Chip arrangements which comprise semiconductor chips and methods for producing the chip arrangements are described below. In this case, the invention is independent of the type of the semiconductor chips used in the arrangement. Any type of semiconductor components, such as integrated semiconductor circuits, for example, may be used as the semiconductor chips. The integrated semiconductor circuits, for example, may include rectifier diodes, zener diodes, TRIACs or field-effect transistors. However, it is also possible to use other semiconductor chips such as processing chips, memory chips, logic chips, sensor chips, chips with microelectromechanical systems (MEMS), and many other types of devices.

Figure 1:
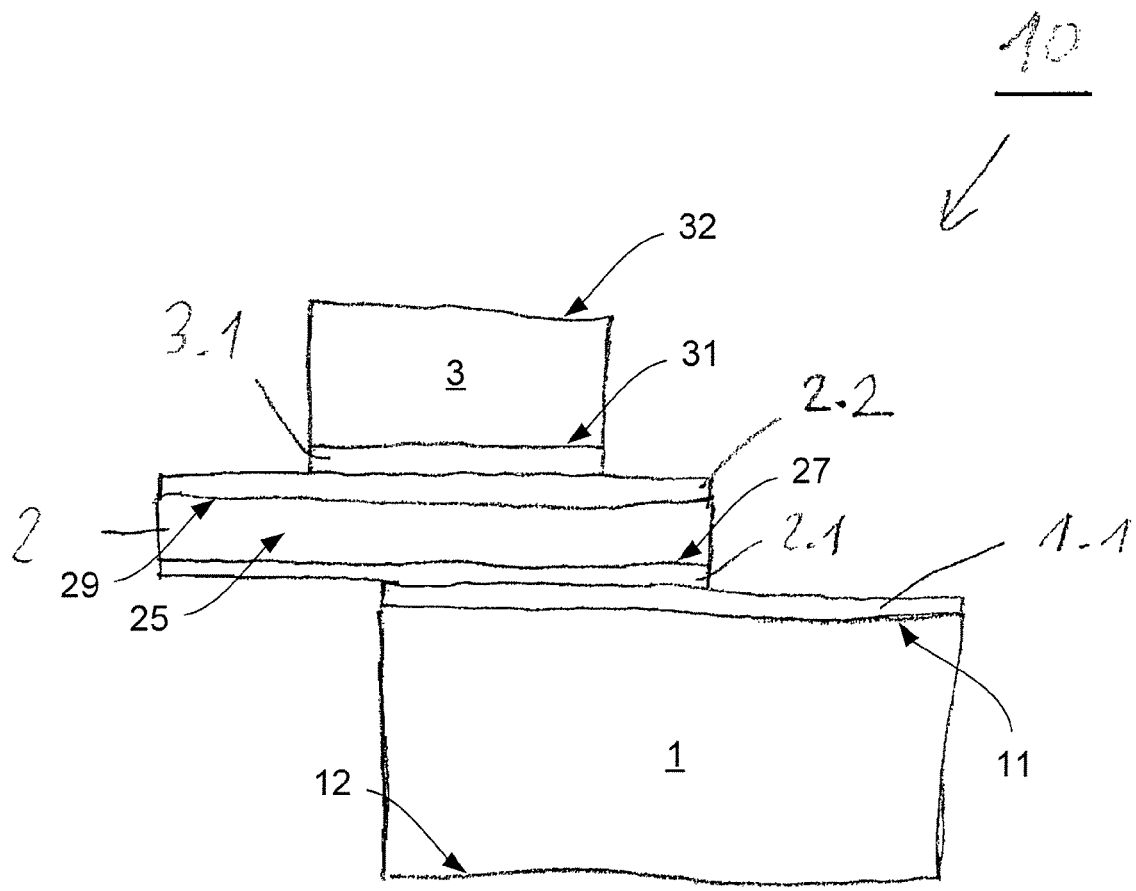
FIG. 1 shows a cross-sectional view of one exemplary embodiment of a chip arrangement.

One exemplary embodiment of a chip arrangement is illustrated schematically in a cross section in FIG. 1. The chip arrangement 10 has a first semiconductor chip 1, which is provided with an electrically conductive region 1.1, or a first chip conductive region, on a first, upper surface or first chip surface 11. The electrically conductive region 1.1 can be applied, as illustrated, over the whole area on the first, upper surface 11 of the semiconductor chip 1. However, it can also be applied only on a partial section of a first, upper surface 11 of the semiconductor chip 1. The electrically conductive region 1.1 may have been produced in the form of an electrically conductive layer onto the first, upper surface 11 of the semiconductor chip 1 by layer deposition and patterning such as, for example, by lithography and etching technology or by a lift-off process or by some other layer deposition and patterning method. It may serve as an electrical contact connection of an electronic component or circuit section which the semiconductor chip 1 comprises. The semiconductor chip 1 may be silicon-based, by way of example.

On the semiconductor chip 1, an electrically insulating layer 2 is applied on or disposed against the first, upper surface 11 thereof. The electrically insulating layer 2 may be embodied as a plate and be, in particular, independently producible and handleable. It can therefore be produced autonomously and then subsequently be applied to or disposed against the first, upper surface of the semiconductor chip 1, rather than applied as an integral part of the semiconductor chip 1.

The electrically insulating layer 2 includes a body 25 formed of an insulating or semi-insulating material, such as a ceramic or a semiconductor material. The electrically insulating layer 2 also includes a first electrically conductive region 2.1 on a first, lower surface or first layer surface 27. The first electrically conductive region 2.1 may be applied as an electrically conductive layer to the first, lower surface 27 of the electrically insulating layer 2 by lithography and etching technology, by a lift-off process, or by some other layer deposition and patterning process. Said region 2.1 may be constructed from a metal having very good electrical conductivity, such as Cu, Ag, Al, Au, Pt or Ni, or from alloys of said metals.

The electrically conductive region 2.1 may extend for example over a partial section of the first, lower surface 27 of the electrically insulating layer 2. On the first, lower surface of the electrically insulating layer 2, one or a plurality of further electrically conductive regions may also be situated on the remaining surface sections, which will be discussed in even more detail further below. The electrically insulating layer 2 is applied on the first semiconductor chip 1 in such a way that an electrical contact between the electrically conductive region 1.1 of the semiconductor chip 1 and the first electrically conductive region 2.1 of the electrically insulating layer 2 is produced. The electrically insulating layer 2 may be embodied as a plate and be applied to or coupled with the first semiconductor chip 1 by soldering using solder paste, solder wire, diffusion soldering, or another form of soldering. Alternatively, the layer 2 may be joined with the first semiconductor chip 1 by adhesive bonding using an electrically conducting adhesive.

The body 25 of the electrically insulating layer 2 is produced, for example, from a material having a coefficient of thermal expansion in a range of 0.2 to 5 times the coefficient of thermal expansion of the semiconductor material of the first semiconductor chip 1. The coefficient of thermal expansion of silicon is 2.5 ppm/K, by way of example. Accordingly, if the first semiconductor chip 1 is produced from the semiconductor material silicon, then the coefficient of thermal expansion of the material of the body 25 of the electrically insulating layer 2 may lie within a range of 0.5 ppm/K to 12.5 ppm/K. In this case, the material of the body 25 of the electrically insulating layer 2 may also be chosen such that it has a coefficient of thermal expansion that is identical or at least very similar to that of the semiconductor material of the first semiconductor chip 1. In the case of silicon as semiconductor material of the first semiconductor chip 1, therefore, silicon or a semiconductor material based on silicon may likewise be used as the material of the body 25 of the electrically insulating layer 2. For the sake of simplicity, by way of example, it is possible to use a piece of a commercially available silicon wafer, the dielectric strength of which is normally sufficient. However, it is also possible for example to choose ceramic materials such as e.g. $Si_3N_4$ (CTE=2.8-3.5 ppm/K), SiC (CTE=4-5 ppm/K), $Al_2O_3$ (CTE=7-9 ppm/K) or $ZrO_2$ (CTE=7-11 ppm/K) as materials for the body 25 of the electrically insulating layer 2. With materials of this type, the coefficient of thermal expansion of which is significantly closer to that of silicon than the coefficient of thermal expansion of the metals otherwise used, such as Cu or Ag, it is possible to achieve a higher strength of the chip arrangement in the case of thermomechanical stress loading.

The second, upper surface 29 of the electrically insulating layer 2 presents a second electrically conductive region 2.2.

The second conductive region 2.2, too, may be formed for example only on a partial section of the upper surface 29 of the electrically insulating layer 2. The second electrically conductive region 2.2 may likewise be applied as an electrically conductive layer on the second, upper surface 29 of the electrically insulating layer 2. One or more electrically conductive regions may also be arranged on the second, upper surface 29 of the electrically insulating layer 2, it being possible for the electrically conductive regions to be produced by conventional layer deposition processes and patterning processes such as lithography and etching technology, or by a lift-off process.

A second semiconductor chip 3 is applied on or disposed against the electrically insulating layer 2. Said second semiconductor chip 3 is provided with an electrically conductive region 3.1, which may likewise be provided by an electrically conductive layer, on a first, lower surface 31. The second semiconductor chip 3 is applied on the electrically insulating layer 2 in such a way that the electrically conductive region 3.1 of the second semiconductor chip 3 is electrically contact-connected to the second electrically conductive region 2.2 of the electrically insulating layer 1. In this case, to name one example, the second semiconductor chip 3 may be adhesively bonded onto the electrically insulating layer 2 by means of an electrically conductive adhesive paste at approximately 200° C.

Figure 2:
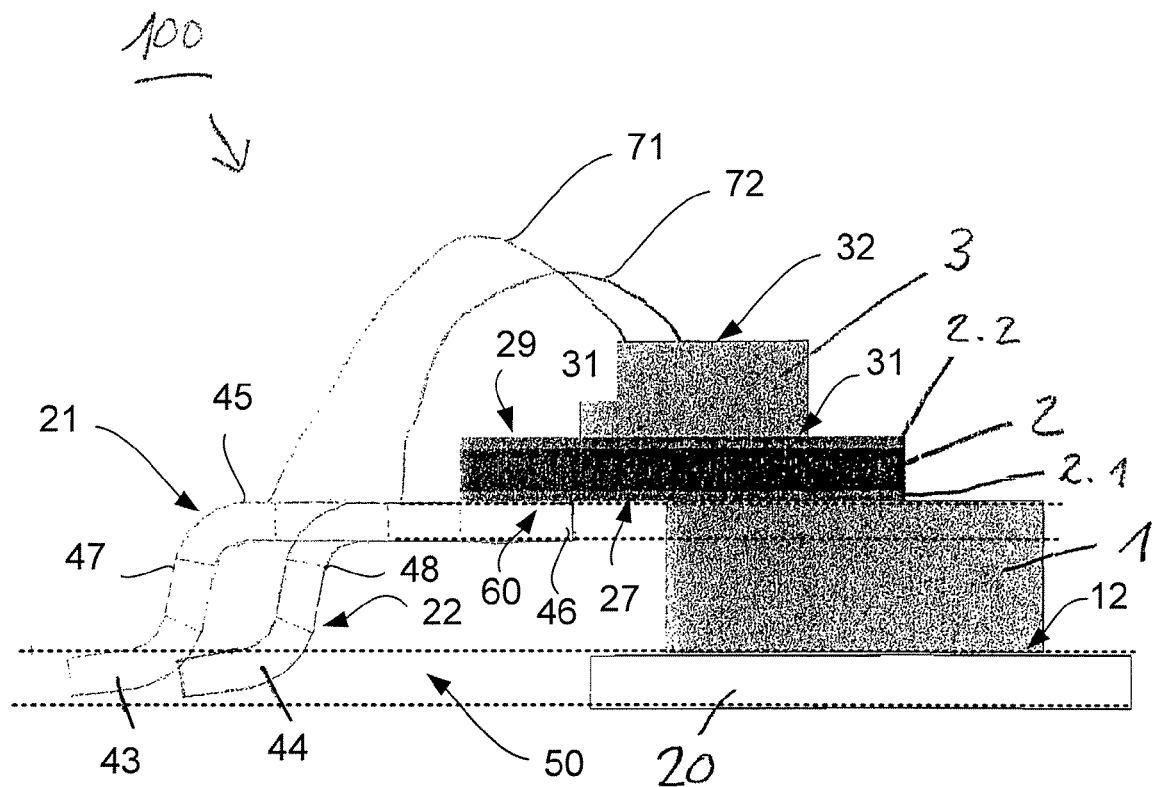
FIG. 2 shows a perspective view of a further exemplary embodiment of a chip arrangement.

A second exemplary embodiment of a chip arrangement is schematically illustrated in a perspective view in FIG. 2. The chip arrangement 100 represents a further development of the chip arrangement 10 shown in FIG. 1, with the chip arrangement 100 having been extended by further elements. The first semiconductor chip 1 may include on a first opposing chip surface 12, which is an opposing, lower surface 12 opposite the first, upper surface 11, a first opposing conductive region not shown. Accordingly, electrical connections may be made to the first semiconductor chip in conductive regions both on a first, upper surface 11 (or first chip surface 11) as well as on a lower surface 12 (or first opposing chip surface 12).

In the chip arrangement 100, the first semiconductor chip 1 is applied on a substrate 20 with the first opposing chip surface 12 disposed on the substrate 20. The substrate, for example, may be a leadframe. The first semiconductor chip 1 may be soldered onto the substrate 20 by means of a soldering process at a temperature >300° C. The first semiconductor chip 1 is therefore electrically contact-connected to the first electrically conductive region 2.1 of the electrically insulating layer 2 at its first, upper surface 11 and to the substrate 20 at its second, lower surface 12. The first semiconductor chip 1 may contain for example a power transistor such as a so-called IGBT (Insulated Gate Bipolar Transistor) in which two electrical connections, namely the connections for the emitter and the gate, are lead to the top side 11 (or first chip surface 11) of the chip, while one electrical connection, namely the connection for the collector, is lead to the lower surface of the chip 12 (or first opposing chip surface 12).

The electrically conductive regions on the upper surface 11 and the lower surface 12 of the first semiconductor chip 1 have been omitted in the drawing of FIG. 2, for the sake of simplicity. The first semiconductor chip 1 may have, on its first, upper surface 11, for example, two electrically conductive regions in the form of two electrically conductive contact layers which are respectively connected to the emitter connection and the gate connection of the power transistor. In this case, the electrically insulating layer 2 has, at its first, lower surface 27, two electrically conductive regions which are electrically connected to the two electrical connection contacts on the first, upper surface 11 of the first semiconductor chip 1, it being possible for the contact to be produced once again by soldering, for example.

Figure 3:
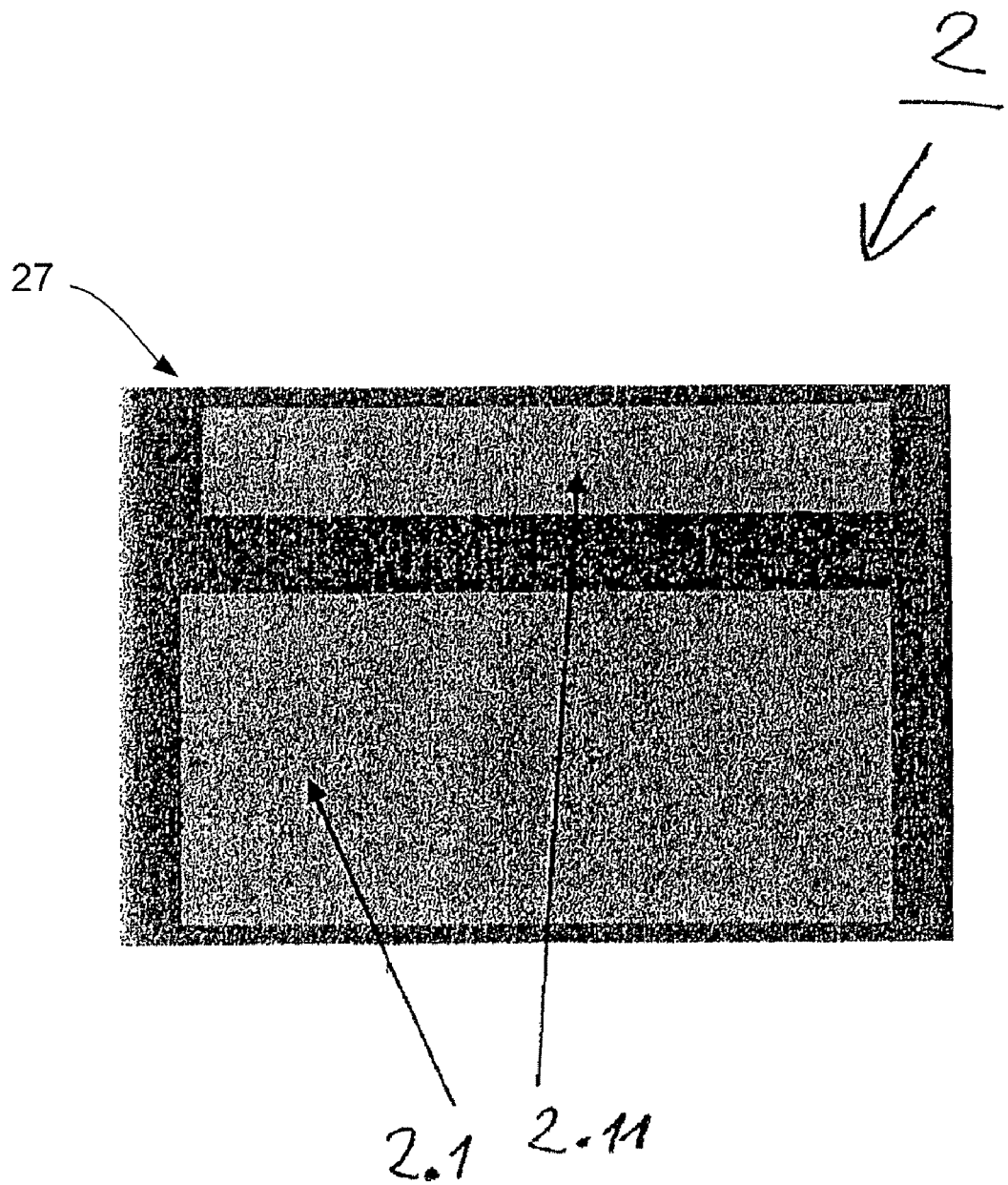
FIG. 3 shows a top view of one exemplary embodiment of an electrically insulating layer presenting a plurality of conducting regions.

FIG. 3 illustrates such an electrically insulating layer 2 in a view from below of its lower, first surface 27. The electrically insulating layer 2 accordingly has a first electrically conductive region 2.1 on its lower, first surface 27. In contrast to the illustrations in FIGS. 1 and 2, the first electrically conductive region 2.1 does not extend as far as the edge of the electrically insulating layer 2. The first electrically conductive region 2.1 is formed for example by an electrically conductive layer, for example composed of a metal such as Cu, Ag, Al, Au, Pt or Ni, or of alloys of said metals.

The first electrically conductive region 2.1 has a rectangular form in the exemplary embodiment of FIG. 3. However, other forms are also conceivable. In addition, the electrically insulating layer 2 has, on its first, lower surface 27, a second electrically conductive region 2.11 spaced apart from the first electrically conductive region 2.1. Said second electrically conductive region 2.11 may be produced for example in the same way and in one and the same work step as the first electrically conductive region 2.1, that is to say for example by a conventional screen printing or lithography method for the deposition and patterning of a metallic layer such as a Cu, Ag or Al layer having a layer thickness with in the range 10-100 μm or more. The larger the layer thickness, the larger the conduction cross-section, too, and the correspondingly greater the currents that can be passed via the electrically conductive layers. The two electrically conductive regions 2.1 and 2.11 may be used for example for forming electrical contacts to corresponding electrical connection contacts on the first, upper surface 11 (FIG. 1) of the first semiconductor chip 1. For this purpose, at one of their ends they are in each case connected to the corresponding electrically conductive regions on the first, upper surface 11 of the first semiconductor chip 1 by soldering. At their respective other end, the electrically conductive regions 2.1 and 2.11 of the electrically insulating layer 2 are connected to electrical conductors, as is explained below.

The exemplary embodiment of a chip arrangement in FIG. 2 shows that said chip arrangement additionally includes electrical conductors 21 and 22. The latter, for example, also may have emerged from one and the same leadframe as the substrate 20, and have been separated from the substrate 20 in the course of the production of the chip arrangement 100. The two electrical conductors 21 and 22 in each case have lower sections 43 and 44, respectively, located in the in the same plane 50 (shown in dotted lines in FIG. 2) of the substrate 20, as well as upper sections 45 and 46, respectively, and angled sections 47 and 48, respectively, located between the upper and lower sections. The upper sections 45 and 46 are arranged to form planar, horizontal surfaces which is aligned with the first, upper surface 11 of the first semiconductor chip 1, i.e. lies in a common plane 60 (shown in dotted lines in FIG. 2) with it. This enables the electrically insulating layer 2 to be mounted with its planar, horizontal lower surface 27 and the electrically conductive regions 2.1 and 2.11 situated thereon onto the electrical conductors 21 and 22 and the first semiconductor chip 1 by soldering, for example.

In the exemplary embodiment illustrated, it may accordingly be provided that the first electrical conductor 21 is electrically contact-connected to the first electrically conductive region 2.1 of the electrically insulating layer 2 and the second electrical conductor 22 is electrically contact-connected to the second electrically conductive region 2.11 of the electrically insulating layer 2. If the first semiconductor chip 1 is formed by an by an IGBT power transistor, for example, then the substrate 20 is connected to the collector connection of the power transistor, while the two electrical conductors 21 and 22 are respectively connected to the emitter connection and the gate connection of the power transistor.

The second semiconductor chip 3 applied on the second, upper surface 29 of the electrically insulating layer 2 may be a logic chip, for example, which controls the first semiconductor chip 1. If, by way of example, the first semiconductor chip 1 is provided by a power transistor as mentioned, then the second semiconductor chip 3 may contain a logic circuit produced using CMOS technology, by way of example, which logic circuit controls the power transistor. For this purpose, electrical connection contacts on the upper surface 32 (or second opposing chip surface 32) of the second semiconductor chip 3 may be connected to the electrical conductors 21 and 22 by bonding wires 71 and 72 as illustrated, while a connection contact on a lower surface 31 of the second semiconductor chip 3 is contact-connected by the second electrically conductive region 2.2 of the upper surface 29 of the electrical insulating layer 2.

The exemplary embodiments of chip arrangements 10 and 100 as illustrated in FIG. 1 and FIG. 2 additionally make it possible to arrange a plurality of semiconductor chips above the first semiconductor chip 1. This is because provision may be made for arranging even further electrically conductive regions, for example in the form of electrical contact layers, along side the electrically conductive region 2.2 on the second, upper surface of the electrically insulating layer 2. These further electrically conductive regions are not connected to one another and serve to form electrical connecting pads for further semiconductor chips which can in each case be arranged with their lower electrical contact connections on said further electrically conductive regions.

As already mentioned, the electrically insulating layer 2 may be formed, for example, as an independently handleable plate. A plate of this type may be first preprocessed independently of the rest of the elements of the chip arrangement by means of the electrically conductive region being formed (i.e., with the corresponding electrical contact layers being applied) on both sides. Afterwards, the plate 2 may be applied to the first, upper surface 11 of the first semiconductor chip 1 for example by means of solder paste, solder wire, diffusion soldering, or otherwise by means of electrically conductive adhesives. When applying a second semiconductor chip 3 to the upper surface 29 of the plate, care must be taken to ensure that the other connecting media withstand this additional thermal process undamaged.

The first semiconductor chip 1 may for example be soldered onto the leadframe 20 at a temperature T>300° C. The plate 2, once metallized on both sides, may then be soldered onto the first semiconductor chip 1 at a temperature such that the metal alloy produced during the soldering-on of the first semiconductor chip 1 does not melt. The second semiconductor chip 3 or if appropriate further semiconductor chips may then be adhesively bonded onto the top side of the plate 2 by means of an electrically conductive adhesive paste at approximately 200° C.

The invention claimed is:
1. An apparatus including a chip arrangement, comprising:
  a first semiconductor chip having a first chip surface presenting a first chip conductive region;
  a second semiconductor chip having a second chip surface presenting a second chip conductive region;
  an electrically insulating layer including:
    a layer body comprised of a material;
    a first layer surface disposed on a side of the layer body having a first layer conductive region; and a second layer surface disposed on an opposing side of the layer body having a second layer conductive region, wherein the layer body electrically insulates the first layer conductive region from the second layer conductive region, wherein the first layer conductive region is electrically coupled with the first chip conductive region and the second layer conductive region is electrically coupled with the second chip conductive region; and a first electrical conductor comprising a first lower section, a first upper section and a first angled section connecting the first lower and first upper sections, wherein the first lower section is located in the plane of a substrate and the first upper section comprises an upper surface which is coplanar with an upper surface of the first semiconductor chip and the first upper section is electrically coupled to the first layer conductive region of the electrically insulating layer.

2. The apparatus according to claim 1, wherein the first upper section of the first electrical conductor is electrically coupled to the first layer conductive region in a portion of the electrically insulating layer which extends laterally over one of the side edges of the first semiconductor chip.

3. An apparatus including a chip arrangement, comprising:
a first semiconductor chip having a first chip surface presenting a first chip conductive region;
a second semiconductor chip having a second chip surface presenting a second chip conductive region;
an electrically insulating layer including:
 a layer body comprised of a material;
 a first layer surface disposed on a side of the layer body having a first layer conductive region; and
 a second layer surface disposed on an opposing side of the layer body having a second layer conductive region,
 wherein the first layer conductive region is electrically coupled with the first chip conductive region and the second layer conductive region is electrically coupled with the second chip conductive region; and
a first electrical conductor comprising a first lower section, a first upper section and a first angled section connecting the first lower and first upper sections, wherein the first lower section is located in the plane of a substrate and the first upper section comprises an upper surface which is coplanar with an upper surface of the first semiconductor chip and the first upper section is electrically coupled to the first layer conductive region of the electrically insulating layer,
wherein the electrically insulating layer comprises an additional first layer conductive region disposed on the first layer surface, the additional first layer conductive region being electrically insulated from the first layer conductive region.

4. The apparatus according to claim 3, further comprising:
a second electrical conductor comprising a second lower section, a second upper section and a second angled section connecting the second lower and second upper sections, wherein the second lower section is located in the plane of the substrate and the second upper section comprises an upper surface which is coplanar with the upper surface of the first semiconductor chip and the second upper section is electrically coupled to the additional first layer conductive region of the electrically insulating layer.

5. The apparatus according to claim 4, wherein the second upper section of the second electrical conductor is electrically coupled to the additional first layer conductive region in a portion of the electrically insulating layer which extends laterally over one of the side edges of the first semiconductor chip.

6. The apparatus according to claim 3, further comprising:
an additional first chip conductive region disposed on the first chip surface, wherein the additional first chip conductive region is electrically coupled with the additional first layer conductive region.

7. The apparatus according to claim 1, wherein the first semiconductor chip has a first opposing chip surface presenting a first opposing chip surface conductive region; and
wherein the first semiconductor chip is applied with the opposing chip surface on the substrate.

8. The apparatus according to claim 7, wherein the first semiconductor chip includes a transistor;
wherein the first chip conductive region of the first chip surface of the first semiconductor chip is electrically coupled to a first connection of the transistor; and
wherein the first opposing chip conductive region is electrically coupled with a second connection of the transistor.

9. The apparatus according to claim 1, wherein the second semiconductor chip includes a logic circuit arranged to control the first semiconductor chip.

* * * * *

UNITED STATES PATENT AND TRADEMARK OFFICE
Certificate

Patent No. 8,129,831 B2                                                        Patented: March 6, 2012

On petition requesting issuance of a certificate for correction of inventorship pursuant to 35 U.S.C. 256, it has been found that the above identified patent, through error and without any deceptive intent, improperly sets forth the inventorship.
    Accordingly, it is hereby certified that the correct inventorship of this patent is: Joachim Mahler, Regensburg (DE); Alfred Haimerl, Sinzing (DE); Michael Bauer, Nittendorf (DE); and Angela Kessler, Regensburg (DE).

Signed and Sealed this Twenty-fourth Day of September 2013.

<div style="text-align:right">

LYNNE A. GURLEY
*Supervisory Patent Examiner*
Art Unit 2811
Technology Center 2800

</div>